(12) United States Patent
Martin et al.

(10) Patent No.: US 11,166,381 B2
(45) Date of Patent: Nov. 2, 2021

(54) SOLDER-PINNING METAL PADS FOR ELECTRONIC COMPONENTS

(71) Applicant: International Business Machines Corporation, Armonk, NY (US)

(72) Inventors: Yves Martin, Ossining, NY (US); Tymon Barwicz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 16/140,883

(22) Filed: Sep. 25, 2018

(65) Prior Publication Data

US 2020/0100369 A1 Mar. 26, 2020

(51) Int. Cl.
*H05K 3/34* (2006.01)
*H05K 1/11* (2006.01)
(Continued)

(52) U.S. Cl.
CPC ............. *H05K 3/3421* (2013.01); *G02B 6/13* (2013.01); *G02B 6/4232* (2013.01); *H01L 24/05* (2013.01); *H01L 24/06* (2013.01); *H01L 24/11* (2013.01); *H01L 24/12* (2013.01); *H01L 24/16* (2013.01); *H05K 1/111* (2013.01); *H05K 3/3436* (2013.01); *H05K 3/3473* (2013.01); *H01L 24/03* (2013.01); *H01L 2224/0401* (2013.01); *H01L 2224/05022* (2013.01); *H01L 2224/05027* (2013.01); *H01L 2224/0566* (2013.01); *H01L 2224/05568* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01);
(Continued)

(58) Field of Classification Search
CPC ..................... H01L 2224/0401; H01L 24/16
See application file for complete search history.

(56) References Cited

U.S. PATENT DOCUMENTS 5,172,852 A 12/1992 Bernardoni et al.
6,392,163 B1 5/2002 Rinne et al.
(Continued)

OTHER PUBLICATIONS

Martin et al., "Toward high-yield 3D self-alignment of flip-chip assemblies via solder surface tension," Electronic Components and Technology Conference (ECTC), 2016 IEEE 66th, (May/Jun. 2016) (7 pages).
(Continued)

*Primary Examiner* — Farun Lu
(74) *Attorney, Agent, or Firm* — Daniel Morris; Michael J. Chang, LLC

(57) ABSTRACT

Solder-pinning metal pads for electronic components and techniques for use thereof to mitigate de-wetting are provided. In one aspect, a structure includes: a substrate; and a solder pad on the substrate, wherein the solder pad has sidewalls extending up from a surface thereof. For instance, the sidewalls can be present at edges of the solder pad, or inset from the edges of the solder pad. The sidewalls can be vertical or extend up from the solder pad at an angle. The sidewalls can be formed from the same material or a different material as the solder pad. A method is also provided that includes forming a solder pad on a substrate, the solder pad comprising sidewalls extending up from a surface thereof.

12 Claims, 9 Drawing Sheets

(51) Int. Cl.
*H01L 23/00* (2006.01)
*G02B 6/13* (2006.01)
*G02B 6/42* (2006.01)

(52) U.S. Cl.
CPC ........... *H01L 2224/05669* (2013.01); *H01L 2224/05671* (2013.01); *H01L 2224/11849* (2013.01)

(56) References Cited

U.S. PATENT DOCUMENTS

| | | | |
|---|---|---|---|
| 7,855,442 B2 * | 12/2010 | Magerlein | H01L 21/76898 257/686 |
| 8,339,798 B2 | 12/2012 | Minoo et al. | |
| 8,466,548 B2 | 6/2013 | Bayerer et al. | |
| 9,312,213 B2 | 4/2016 | Cho et al. | |
| 9,466,590 B1 * | 10/2016 | Barwicz | H01L 24/05 |
| 9,543,736 B1 | 1/2017 | Barwicz et al. | |
| 9,606,308 B2 | 3/2017 | Barwicz et al. | |
| 10,163,827 B1 * | 12/2018 | Tsao | H01L 25/50 |
| 2009/0115036 A1 | 5/2009 | Shin | |
| 2009/0218688 A1 | 9/2009 | Ayotte et al. | |
| 2011/0049705 A1 * | 3/2011 | Liu | H01L 24/11 257/737 |
| 2012/0256312 A1 * | 10/2012 | Tsujimoto | H01L 24/05 257/737 |
| 2016/0043294 A1 | 2/2016 | Palaniswamy et al. | |

OTHER PUBLICATIONS

P.A. Magill et al., "Flip chip overview," Multi-Chip Module Conference, Feb. 1996, pp. 28-33.

* cited by examiner

SOLDER-PINNING METAL PADS FOR ELECTRONIC COMPONENTS

FIELD OF THE INVENTION

The present invention relates to solder bonding for electronic components, and more particularly, to solder-pinning metal pads for electronic components and techniques for use thereof to mitigate de-wetting even when solder thickness is small.

BACKGROUND OF THE INVENTION

Solder pads are ubiquitously used in the micro-electronics industry for electrical and mechanical contacts or connections between integrated circuits (ICs) and/or between printed circuit boards (PCBs). More recently, solder pads are also forming the connections between opto-electronics and integrated photonic circuits and components.

Typically, the surfaces of circuits to be connected are coated with metal pads (called under-bump metallization (UBM) pads). Solder metal is deposited on some of the metal pads. The surfaces of two circuits to be connected are brought into close contact and the temperature is elevated temporarily beyond the melting temperature of the solder. The melted solder then wicks the metal pads and establishes electrical contacts between the two circuits in close contact. Upon cooling, the solder solidifies and keeps the two circuits mechanically and electrically connected.

With recent applications of this technique, alignment between the two soldered parts is provided by the surface-tension of the solder during the bonding operation when the solder is melted. This solder-induced alignment technique offers the advantage to bypass the use of precise and expensive equipment for accurate positioning of parts during assembly. Advantageously, it opens the door to the assembly of opto-electronic components in large volume, which is otherwise very costly.

However, to be effective this alignment technique requires low amounts of solder as compared to traditional solder bumps. For instance, the deposited solder thickness (e.g., from 3 micrometers (μm) to 15 μm) for this technique is preferably an order of magnitude lower than the typical solder thickness on micro-electronic chips (e.g., from 50 μm to 100 μm). As a result, the solder tends to de-wet the solder pads where it had been deposited.

Therefore, techniques for preventing de-wetting of solder on pads even when the solder thickness is small would be desirable.

SUMMARY OF THE INVENTION

The present invention provides solder-pinning metal pads for electronic components and techniques for use thereof to mitigate de-wetting even when solder thickness is small. In one aspect of the invention, a structure is provided. The structure includes: a substrate; and a solder pad on the substrate, wherein the solder pad has sidewalls extending up from a surface thereof. For instance, the sidewalls can be present at edges of the solder pad, or inset from the edges of the solder pad. The sidewalls can be vertical or extend up from the solder pad at an angle. The sidewalls can be formed from the same material or a different material as the solder pad.

In another aspect of the invention, a method is provided. The method includes forming a solder pad on a substrate, the solder pad comprising sidewalls extending up from a surface thereof. Further, a solder reservoir pad can be formed on the substrate; a conduit pad can be formed on the substrate connecting the solder reservoir pad to the solder pad; and the sidewalls can be formed in between at least one of i) the solder reservoir pad and the conduit pad, and ii) the conduit pad and the solder pad.

In yet another aspect of the invention, a structure is provided. The structure includes: a first chip having a first solder pad; a second chip having a second solder pad, wherein at least one of the first solder pad and the second solder pad has sidewalls extending up from a surface thereof; and solder forming at least one solder connection between the first solder pad and the second solder pad.

A more complete understanding of the present invention, as well as further features and advantages of the present invention, will be obtained by reference to the following detailed description and drawings.

DETAILED DESCRIPTION OF PREFERRED EMBODIMENTS

Provided herein are under-bump metallization (UBM) metal pad designs having unique geometries that pin the solder and thereby reduce de-wetting of solder off of the UBM pads. The present UBM metal pad designs apply favorably to situations when the solder thickness is small, and where the wetting contact angle is otherwise prohibitively low. As highlighted above, small solder thicknesses (e.g., from 3 micrometers (μm) to 10 μm, and ranges therebetween) may be employed in processes where alignment between the two soldered parts is provided by the surface-tension of the solder during the bonding operation when the solder is melted. See, for example, Martin et al., "Toward high-yield 3D self-alignment of flip-chip assemblies via solder surface tension," Electronic Components and Technology Conference (ECTC), 2016 IEEE 66$^{th}$, (May/Jun. 2016) (7 pages), the contents of which are incorporated by reference as if fully set forth herein.

As will be described in detail below, de-wetting occurs when the angle θ between the solder surface and the substrate surface, where the solder surface meets the UBM, is less than a minimum angle θm, called the minimum contact angle. The angle θ of a solder bump depends on the amount of solder deposited onto the pads. Namely, solder is first deposited over the solder pads (e.g., using an electroplating process, an injection molded solder (IMS) process, etc.). See, for example, FIG. 1.

Figure 1:
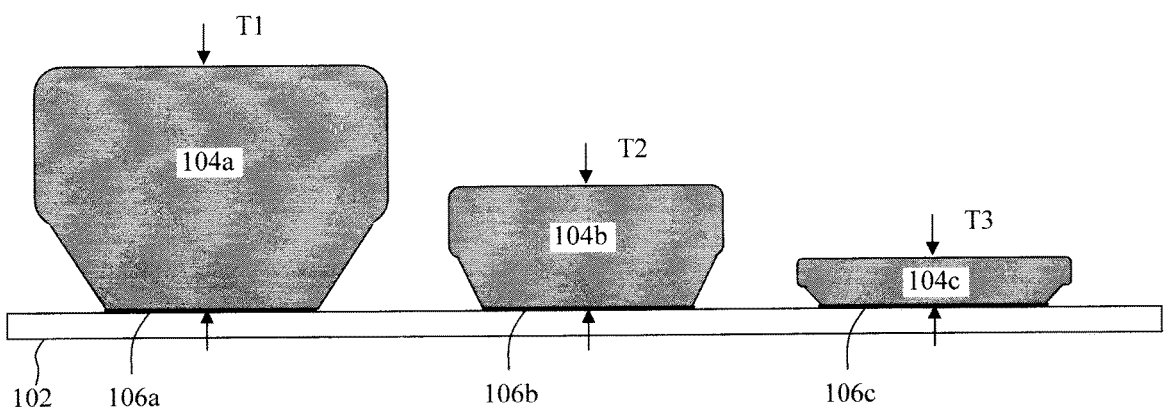
FIG. 1 is a diagram illustrating three different scenarios where solder of differing thicknesses is electroplated onto conventional UBM pads.

FIG. 1 depicts three different scenarios where solder 104a, 104b and 104c of differing thicknesses (i.e., T1, T2 and T3) is electroplated onto generic UBM pads 106a, 106b and 106c, respectively, over a substrate 102. In this example, T1>T2>T3. For instance, according to an exemplary embodiment, T1 is from 50 μm to 100 μm, and ranges therebetween, T2 is from 10 μm to 50 μm, and ranges therebetween, and T3 is from 3 μm to 10 μm, and ranges therebetween.

The deposited solder 104a, 104b and 104c is then melted (e.g., in the presence of a flux that removes the solder oxide) to form solder balls 202a, 202b and 202c on the UBM pads 106a, 106b and 106c, respectively. See FIG. 2.

Figure 2:
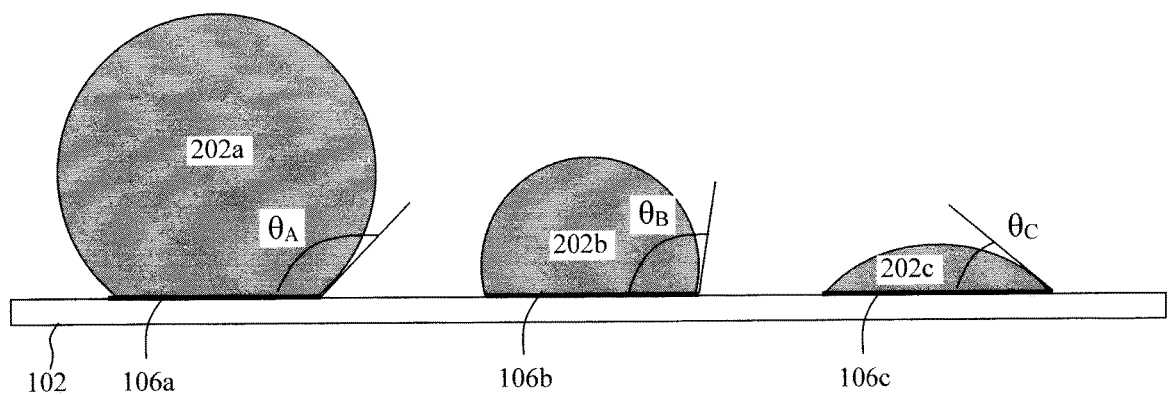
FIG. 2 is a diagram illustrating the deposited solder is melted to form solder balls on the UBM pads.

As shown in FIG. 2, each solder ball 202a, 202b and 202c is a portion of a sphere, varying from an almost full sphere (see solder ball 202a) down to a thin sphere cap (see solder ball 202c). The shape of the sphere is a direct function of the initial amount of solder 104a, 104b and 104c deposited over the UBM pads 106a, 106b and 106c (see FIG. 1). For instance, the thin sphere cap 202c results from a small amount of solder deposited over the UBM pad 106c.

FIG. 2 highlights the contact angle $\theta_A$, $\theta_B$ and $\theta_C$ between the surface of the solder balls 202a, 202b and 202c and the surface of the substrate 102, where the solder ball surface meets the UBM pads 106a, 106b and 106c. For a large amount of solder such as with solder balls 202a and 202b, the resulting contact angle $\theta_A$ and $\theta_B$ is large (e.g., greater than 90 degrees). By contrast, for a small amount of solder such as with solder ball 202c, the resulting contact angle $\theta_C$ is small (e.g., less than 90 degrees).

Figure 3:
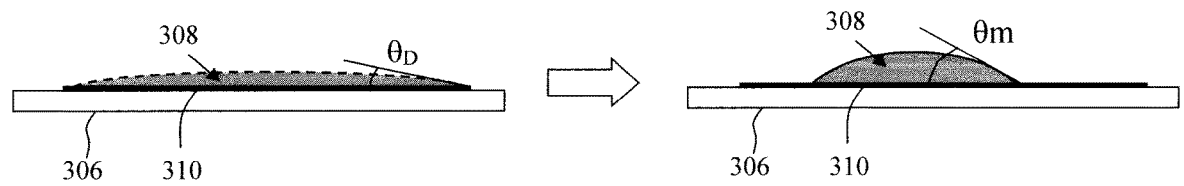
FIG. 3 is a diagram illustrating how small amounts of solder pulls back and de-wets a portion of the UBM pad.

However, for a very small amount of solder 308 (e.g., on the order of from 1 micrometer (μm) to 15 μm) deposited on a conventional UBM pad 310 (over a substrate 306), the situation depicted in FIG. 3 can undesirably occur. For instance, after raising the temperature to melt the solder 308, the solder 308 first attempts to form a very thin cap over the UBM pad 310 as shown in the left illustration in FIG. 3. However, the corresponding angle $\theta_D$ is small (e.g., less than 10 degrees and preferably less than 3 degrees), and below a minimum contact angle θm that the material combination (solder+UBM) can sustain. For most UBM materials, θm is in the range of from 3 degrees to 10 degrees, and ranges therebetween. As a result, the solder 308 pulls back and de-wets a portion of the UBM pad 310, until the contact angle θm is realized. See the right illustration in FIG. 3. Thus, with conventional solder pad designs, it is not possible to realize a thin layer of melted solder over a UBM pad.

Figure 4:
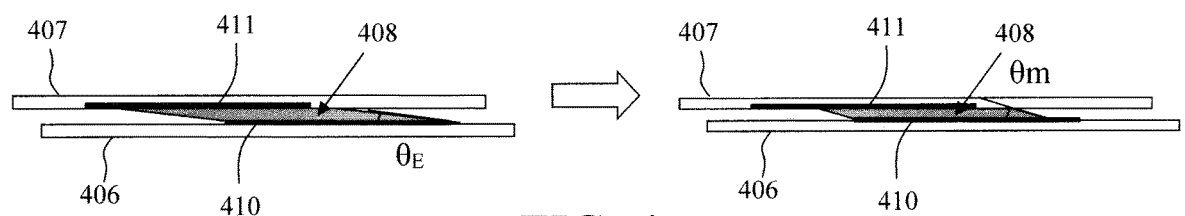
FIG. 4 is a diagram illustrating an alignment process based on the pull force provided by the surface tension of melted solder, and how de-wetting with conventional UBM pads substantially reduces the lateral pull force, hampering alignment.

However, as highlighted above, use of thin solder is desired in techniques where precise alignment of a chip is obtained via the pull force provided by the surface tension of melted solder, between chips and a substrate. See, for example, U.S. Pat. No. 9,466,590 issued to Barwicz et al., entitled "Optimized Solder Pads for Microelectronic Components" (hereinafter "U.S. Pat. No. 9,466,590"); U.S. Pat. No. 9,543,736 issued to Barwicz et al., entitled "Optimized Solder Pads for Solder Induced Alignment of Opto-Electronic Chips"; and U.S. Pat. No. 9,606,308 issued to Barwicz et al. entitled "Three Dimensional Self-Alignment of Flip Chip Assembly Using Solder Surface Tension During Solder Reflow", the contents of each of which are incorporated by reference as if fully set forth herein. Namely, referring to FIG. 4, for lateral alignment of the chips, a lateral offset of the UBM pads 410 and 411 of the corresponding substrate 406 and chip 407 is provided, and a thin solder layer 408 is required (e.g., on the order of about 10 μm, compared to the lateral dimensions of the pads which are on the order of 100 μm). See, for example, the left illustration in FIG. 4 which represents the desired shape of the solder upon melting. The corresponding contact angle $\theta_E$ is small, and therefore, the solder readily de-wets the pads until the contact angle reaches θm, as shown in the right illustration in FIG. 4. In this final state, the lateral pull force is substantially reduced and alignment of the chip is hampered.

Figure 5:
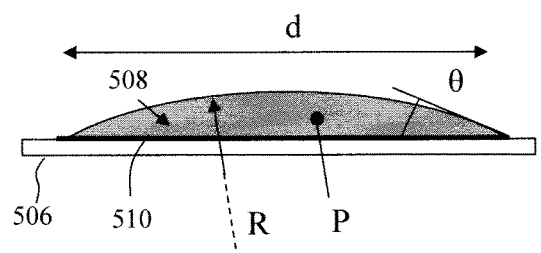
FIG. 5 is a diagram illustrating surface radius of curvature R of solder present on a circular UBM pad of diameter d.

Further, for a given surface curvature there is an associated pressure (P) inside the liquid solder, given as:

$$P=\gamma/R,$$

wherein γ is the surface tension constant associated with the solder material and R is the surface radius of curvature. See FIG. 5 illustrating solder 508 present on UBM pad 510 over substrate 506. For a circular UBM pad 510 of diameter d, R is calculated as a function of d and contact angle θ:

$$R=d/2 \sin \theta, \text{ and}$$

$$P=2\gamma \sin \theta/d.$$

Figure 6:
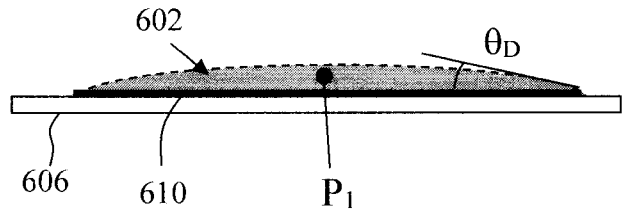
FIG. 6 is a diagram illustrating contact angle $\theta_D$ of a small amount of solder on a UBM pad of diameter d.
Figure 7:
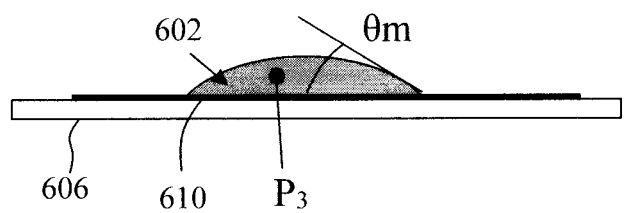
FIG. 7 is a diagram illustrating how, as a result of de-wetting, the smallest achievable θ is θm.
Figure 8:
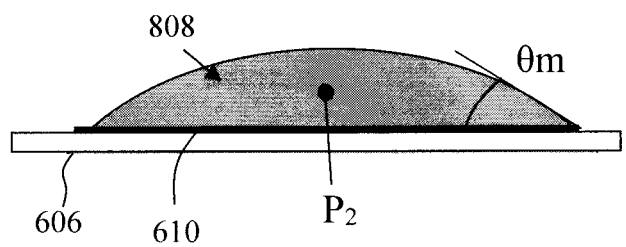
FIG. 8 is a diagram illustrating the amount of deposited solder being increased to achieve at least the minimum contact angle θm and to prevent de-wetting.

For a given pad diameter d, the pressure inside of the solder is directly related to the contact angle θ. Keeping the above-mentioned pressure small (e.g., on the order of 1000 Newton per square meter ($N/m^2$) or less) is important to the above-described method of alignment via the pull force provided by the surface tension of melted solder. See, for example, FIG. 6, where contact angle $\theta_D$ of a small amount of solder 602 on a UBM pad 610 of diameter d (over a substrate 606) results in a small pressure P1. However, as described above, this small pressure P1 cannot be readily achieved with conventional solder pad designs (like UBM pad 610) since the smallest achievable θ is θm. As a result, de-wetting of the UBM pad 610 occurs until the contact angle θm is realized. See FIG. 7. The result is an undesirable increase in pressure from P1 to P3. Increasing the amount of deposited solder 808 to achieve at least the minimum contact angle θm and prevent de-wetting can reduce the pressure from P3 to P2. See FIG. 8. However, this approach is not sufficient to achieve pressures small enough to use for alignment purposes, i.e., P1<P2<P3.

Advantageously, the present UBM pad designs have unique geometries that pin the solder onto the edges of the pads. In order to suppress de-wetting, the present pad designs incorporate a change of slope in the pad edge so that the local contact angle θ between the solder surface and the pad remains large, preferably greater than 20 degrees (or substantially greater than the minimum contact angle θm on the order of 10 degrees that a typical material combination, i.e., solder+UBM, can sustain) even for thin solder thickness and for a large-even negative-radius of curvature of the solder surface. As provided above, as a general rule of thumb, for most UBM materials θm is in the range of from 3 degrees to 10 degrees, and ranges therebetween.

For example, according to one exemplary embodiment, a recessed UBM solder pad design is employed having a substantially vertical (e.g., +10 degrees from normal to the substrate) sidewall along the edge of the solder pad. See FIG. 9 which illustrates an exemplary methodology 900 for forming a recessed UBM solder pad in accordance with the present techniques.

Figure 9:
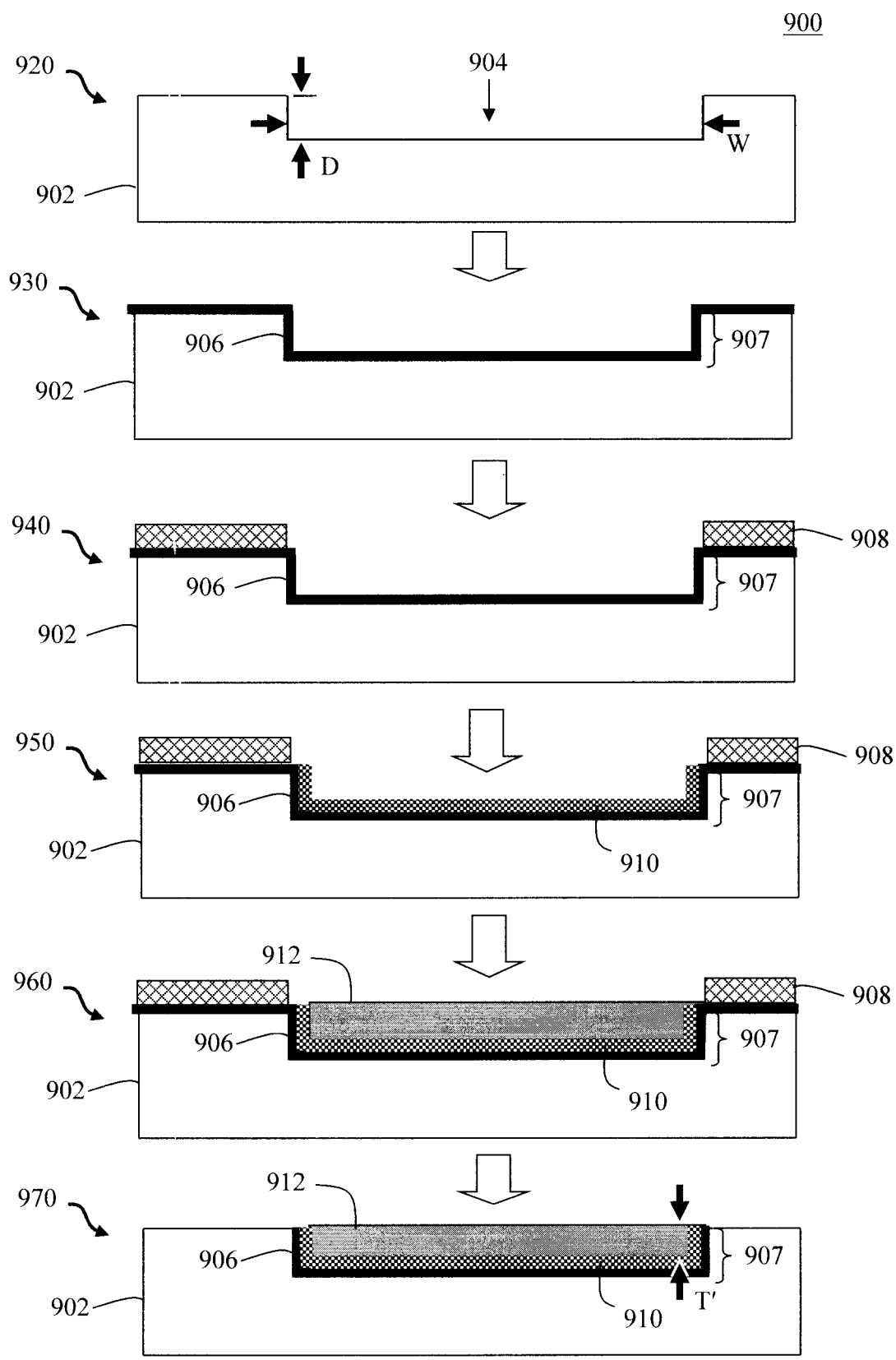
FIG. 9 is a diagram illustrating an exemplary methodology for forming a recessed UBM solder pad having a substantially vertical sidewall along the edge of the solder pad according to an embodiment of the present invention.

As shown in FIG. 9, the process begins in step 920 by forming at least one shallow cavity 904 in a substrate 902. By way of example only, the substrate 902 can be formed from materials such as glass, ceramic materials such as sintered glass, "organic" materials such as the non-conductive top surface of a printed-circuit board (PCB) and/or advanced types of "chip-carrier" such as semiconductor materials like silicon (Si), germanium (Ge), III-V materials like gallium arsenide (GaAs), etc.

Standard lithography and etching techniques can be employed to form the cavity 904 in substrate 902. In one embodiment, a directional (anisotropic) etching technique such as reactive ion etching (RIE) or crystallographic wet etching can be employed for the cavity etch. In another embodiment, an isotropic etching technique can be used. According to an exemplary embodiment, the cavity 904 is patterned having a depth D in the substrate 902 of from 1 µm to 15 µm and ranges therebetween, and a width W of from 30 µm to 500 µm and ranges therebetween.

As shown in step 930, the bottom and sidewalls of the cavity 904 are then covered with a first layer of UBM metal 906. The UBM metals that are deposited along the sidewalls of the cavity 904 form the vertical sidewall portions 907 of the present solder pad design. By way of example only, suitable UBM metals 906 include, but are not limited to, metals such as nickel (Ni), copper (Cu), gold (Au), titanium (Ti) chromium (Cr) and/or iron (Fe), as well as noble and non-dissolving materials such as platinum (Pt), palladium (Pd) and/or ruthenium (Ru). For instance, the UBM metals 906 deposited into cavity 904 can be configured as a stack of layers, each layer containing one or more of these foregoing materials. For example, the UBM pads might be formed from a tri-layer of Au/Ni/Cu. This first layer of UBM metal 906 is deposited as a continuous blanket layer (e.g., using a vacuum deposition process) which will act as an electrical conductor for subsequent electroplating processes.

In step 940, a lithographically patterned photoresist 908 is formed on the substrate 902 masking all but the cavity 904. An electroplating process (via the previously deposited first layer of UBM metal 906) is then used to deposit one or more second/additional layers of UBM metal 910 through the openings in the patterned photoresist 908. See step 950. The result is a solder pad having substantially vertical sidewalls 907 extending up from a surface thereof. As provided above, these sidewalls 907 help pin the solder onto the pad.

As shown in step 960, solder 912 is deposited through the patterned photoresist 908. According to an exemplary embodiment, the solder 908 is electroplated onto the UBM metals 910. Alternatively, a process such as injection molded solder (IMS) can be employed to deposit the solder 912 on top of the UBM metals 910. IMS involves use of an injection head that deposits molten solder from a reservoir onto selective regions of a work surface. A vacuum can be used to facilitate the solder flow from the injection head onto the workpiece. See, for example, U.S. patent application Ser. No. 15/719,451 by Nah et al., entitled "Molten Solder Injection Head with Vacuum Filter and Differential Gauge System," the contents of which are incorporated by reference as if fully set forth herein.

In one exemplary embodiment, the solder 912 is deposited to a small thickness T', e.g., to enable the small pressures needed for the above-described alignment techniques that leverages the pull force provided by the surface tension of melted solder. By way of example only, T' is from 3 µm to 15 µm, and ranges therebetween, e.g., from 5 µm to 10 µm.

Following deposition of the solder 912, the patterned photoresist 908 is removed as are portions of the (vacuum deposited) first layer of UBM metal 906 that are not covered by the electroplated metals (i.e., those portions outside the cavity 904). See step 970.

It is notable that the seed layer is not required for some type of depositions. In that case, depositing a preliminary blanket UBM metal layer prior to resist patterning is not needed.

Figure 10:
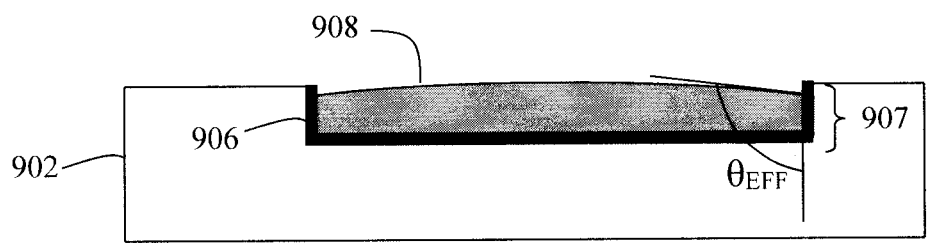
FIG. 10 is a diagram illustrating solder in the recessed UBM solder pad taking on a slightly convex shape upon melting according to an embodiment of the present invention.
Figure 11:
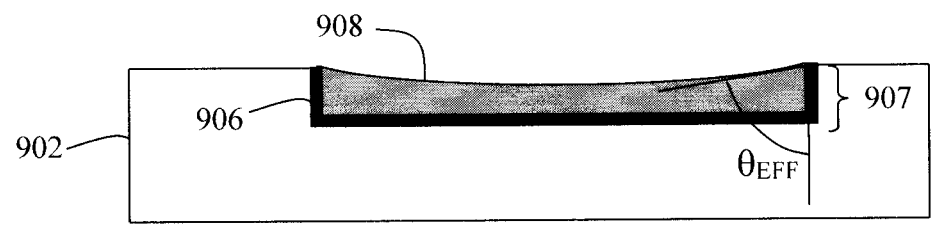
FIG. 11 is a diagram illustrating solder in the recessed UBM solder pad taking on a slightly concave shape upon melting according to an embodiment of the present invention.

Upon melting, the solder 908 takes on a slightly convex (see FIG. 10) or concave (see FIG. 11) shape, depending on how much solder 908 fills the cavity and the wetting property of the UBM metals 906. A key attribute of the present solder pad design is that the effective solder angle, $\theta_{EFF}$ remains large (e.g., greater than 10 degrees, for example, from 80 to 100 degrees) and greater than θm in all cases case (i.e., whether the solder 908 is convex or concave). As shown in FIG. 10 and FIG. 11, $\theta_{EFF}$ is the angle the surface of the solder 908 has relative to the vertical sidewall portion 907. In fact, $\theta_{EFF}$ remains large and nearly 90 degrees (e.g., ±10 degrees) for a large range of conditions of solder fill and wetting property of the UBMs. Namely, in nearly all cases $\theta_{EFF}$ is from 80 degrees to 100 degrees and ranges therebetween. Effectively, the vertical sidewall portions 907 of the solder pad "pin" the edge of the liquid solder 908 surface and prevents it from de-wetting the UBM metals 906.

Figure 12:
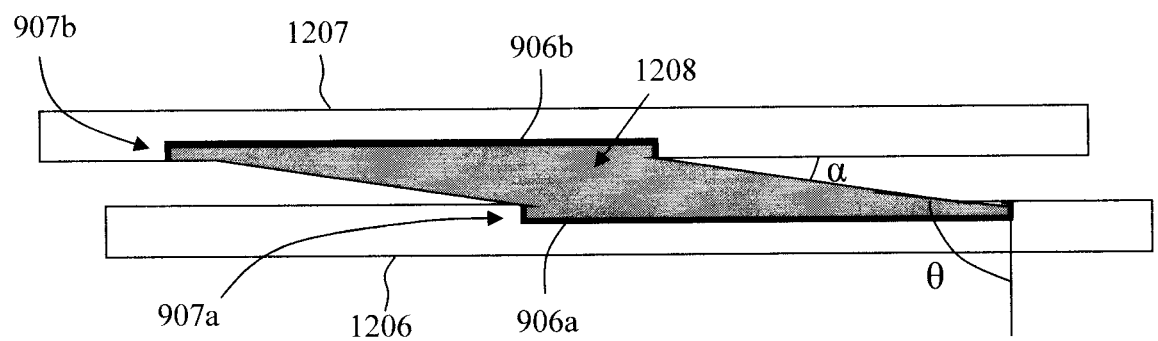
FIG. 12 is a diagram illustrating a solder-induced alignment technique employing the present UBM solder pad design according to an embodiment of the present invention.

According to an exemplary embodiment, the present UBM solder pad designs are employed in a solder-induced alignment technique. See FIG. 12. This example depicts use of the recessed UBM solder pad design described in conjunction with the description of FIG. 9, above. However, any of the present solder pad designs may be employed. As shown in FIG. 12, a lateral offset of (recessed) UBM pads 906a and 906b of a corresponding substrate 1206 and chip 1207 is present. Each UBM pad 906a and 906b has vertical sidewall portions 907a and 907b, respectively. As described above, a thin solder layer 1208 is required (e.g., having a thickness of from 3 μm to 15 μm, and ranges therebetween) for this solder-induced alignment technique. Advantageously, unlike the de-wetting situation that occurs with the conventional pads designs (see, for example, FIG. 4 described above), the present UBM solder pad designs via the vertical sidewall portions 907a and 907b prevent the solder from de-wetting by maintaining a solder angle θ substantially above the minimum contact angle θm (e.g., at least θm+5 degrees—see below) even while the overall angle α between substrate and chip is very shallow. See FIG. 12. θm is the minimal contact angle achievable, i.e., the material itself has a contact angle to the solder pad (contact angle of the solder) and that is the minimum contact angle one can achieve in the pad. Namely, de-wetting will occur before you can get a smaller angle.

Figure 13:
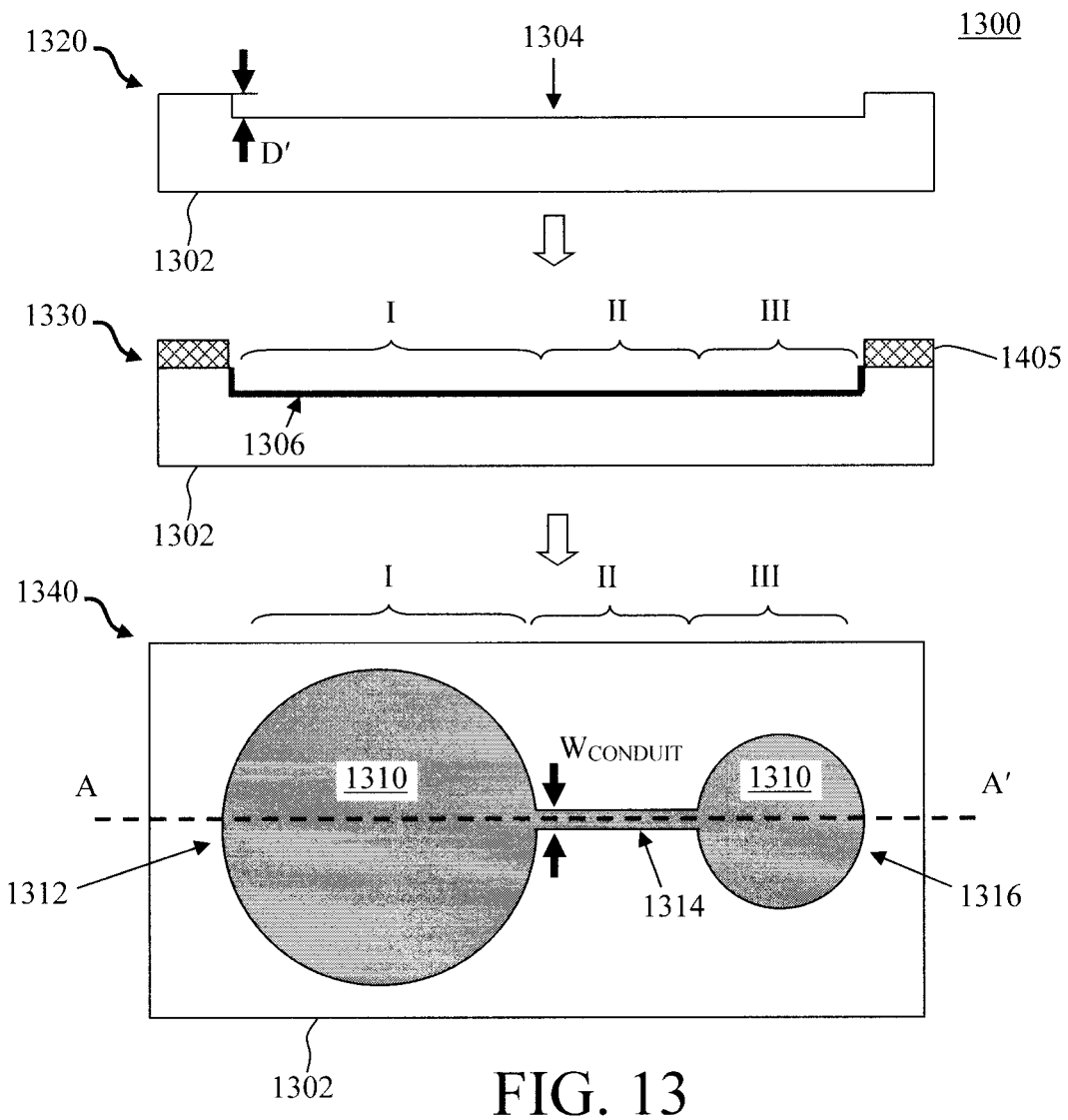
FIG. 13 is a diagram illustrating an exemplary methodology for forming a solder pad/solder reservoir structure employing the present UBM solder pad design according to an embodiment of the present invention.

According to another exemplary embodiment, the present UBM solder pad designs are employed in a solder pad/solder reservoir configuration. As will be described in detail below, this configuration includes at least one solder pad connected to a larger solder reservoir pad via a narrow conduit (pad), all on a substrate. See, for example, methodology 1300 of FIG. 13. Steps 1320 and 1330 of FIG. 13 depict cross-sectional cuts, and step 1340 depicts a top-down view of the solder pad/solder reservoir. For reference, line A-A' provided in step 1340 illustrates the orientation of the cross-sectional cuts in the previous steps.

As shown in step 1320, the process begins by forming a shallow cavity 1304 in a substrate 1302, e.g., using standard lithography and etching techniques. Suitable substrate materials were provided above. According to an exemplary embodiment, the cavity 1304 has a depth D' of from 1 μm to 15 μm and ranges therebetween. It is notable that, when viewed from the top-down, cavity 1304 will form the shape of the solder pad, the conduit, and the solder reservoir pad. Brackets are used in FIG. 13 to illustrate the regions I, II, and III of the cavity 1304 corresponding to the solder reservoir pad, the conduit, and solder pad, respectively.

In the same general manner as described above, the bottom and sidewalls of the cavity 1304 are then covered with UBM metals 1306, e.g., via vacuum deposition and electroplating through a (first) lithographically patterned photoresist 1305. See step 1330. Suitable UBM metals were provided above. It is notable that the techniques described in accordance with the description of FIG. 9, above, may also be similarly applied in forming a solder pad/conduit/solder reservoir design, whereby a preliminary blanket UBM metal layer is deposited prior to resist patterning that can later be used as an electrical conductor for plating additional UBM metal and solder.

Following deposition of UBM metals 1306, the patterned photoresist 1305 can be removed, and solder 1310 is deposited (e.g., via electrodeposition, IMS, etc.) on top of the UBM metals 1306. See step 1340 (illustrated by way of a top-down view). As shown in step 1340, the sidewalls of the UBM metal 1306 are present along a solder reservoir pad 1312, a conduit 1314, and a solder pad 1316.

In the example depicted in FIG. 13, the solder reservoir pad 1312 and the solder pad 1316 are circular. However, this is merely an example. Solder pads of any shape can be used in accordance with the present techniques. For instance, by way of example only, the solder pad and solder reservoir pad can each be square-shaped, oval shaped, etc. See, for example, FIG. 14 (described below) which employs square-shaped pads. According to an exemplary embodiment, the solder reservoir pad 1312 has an area that is from 0.5 times to 4 times larger than the area of the solder pad 1316. See, for example, U.S. Pat. No. 9,466,590. By way of example only, the conduit 1314 can have a width $W_{CONDUIT}$ of from 5 μm to 75 μm and ranges therebetween. Further, it is notable that while FIG. 13 depicts a circular solder pad 1306 and a circular solder reservoir pad 1308, this is merely an example.

The notion here is that solder 1310 is deposited onto both the solder reservoir pad 1312 and the solder pad 1316. If during bonding/alignment there is not enough solder 1310 present on solder pad 1316, then solder 1310 will naturally flow from the solder reservoir pad 1312 via the conduit 1314 to the solder pad 1316, or vice versa. The mechanism for this flow is based on hydrostatic forces and the pressure within the (liquid) solder 1310. Namely, the solder 1310 has a greater surface radius of curvature (R) on the solder reservoir pad 1312 than on the solder pad 1316. Thus, the pressure (P) on the solder reservoir pad 1312 does not fluctuate that much. However, a deficit/excess of solder 1310 on the solder pad 1316 will cause an increase/decrease in solder pressure in the conduit 1314, causing solder 1310 to flow from the solder reservoir pad 1312 to the solder pad 1316 or vice versa.

Figure 14:
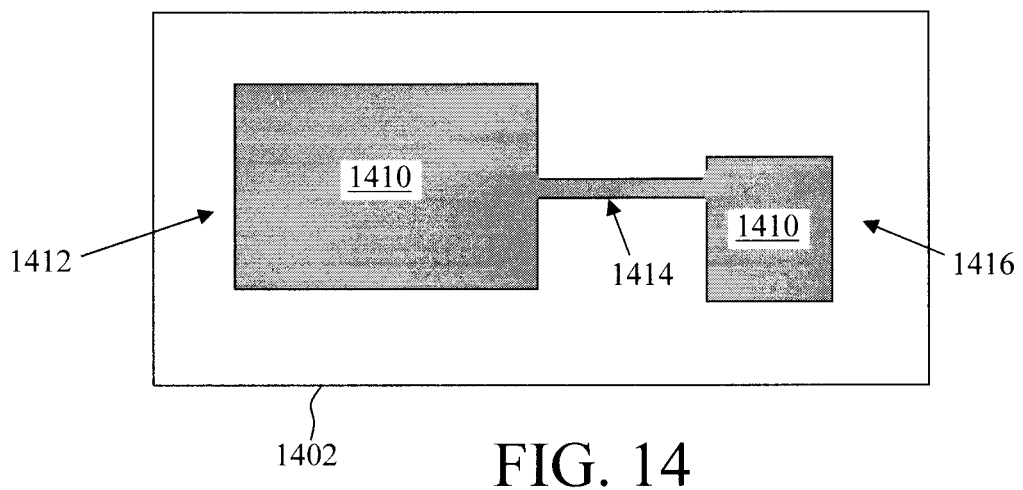
FIG. 14 is a top-down diagram illustrating an exemplary solder pad/solder reservoir structure having square/rectangular-shaped pads according to an embodiment of the present invention.

FIG. 14 is a top-down diagram illustrating a variant of the solder pad/solder reservoir design having square/rectangular-shaped pads. Namely, as shown in FIG. 14, this configuration includes at least one solder pad 1416 connected to a larger solder reservoir pad 1412 via a narrow conduit (pad) 1414, all on a substrate 1402. Solder 1410 is deposited onto both the solder reservoir pad 1412 and the solder pad 1416.

Figure 15:
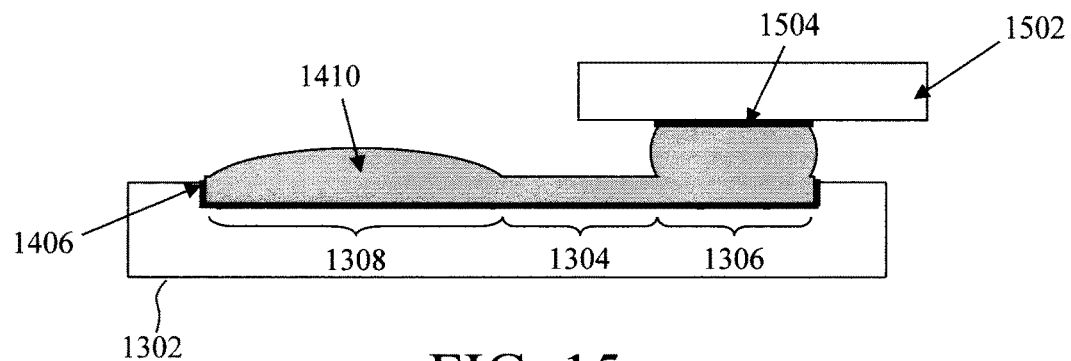
FIG. 15 is a diagram illustrating an exemplary scenario where an excess of solder slightly overfills the solder reservoir according to an embodiment of the present invention.
Figure 16:
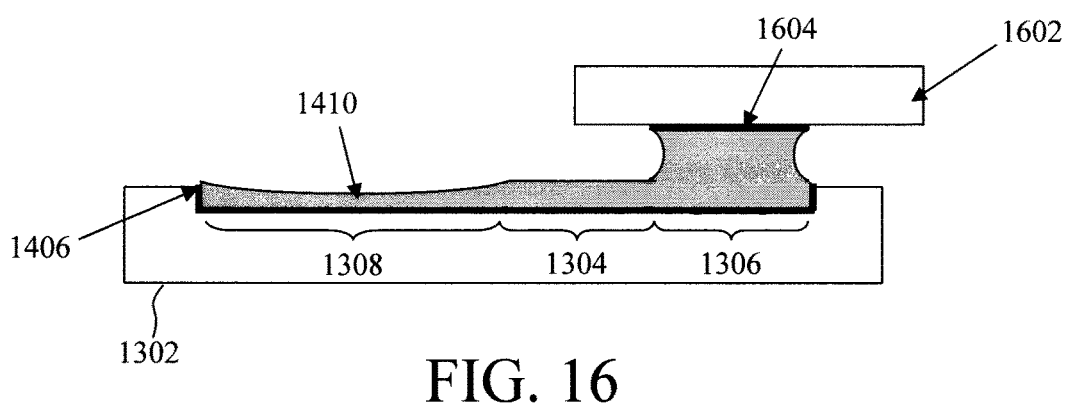
FIG. 16 is a diagram illustrating an exemplary scenario where a deficit of solder slightly underfills the solder reservoir according to an embodiment of the present invention.
Figure 17:
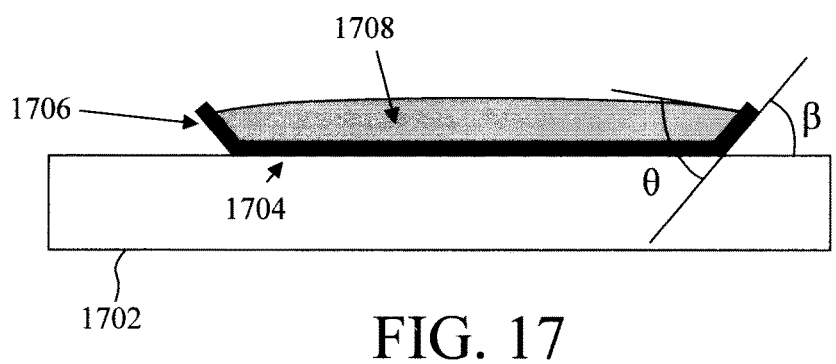
FIG. 17 is a diagram illustrating an alternative embodiment where the present UBM solder pad has substantially vertical sidewalls that make an angle β above the substrate according to an embodiment of the present invention.

Based on this solder reservoir design, FIG. 15 illustrates the exemplary scenario where an excess of solder 1410 slightly overfills the (recessed) solder reservoir pad 1308 recessed in substrate 1302, and FIG. 16 illustrates the exemplary scenario where a deficit of solder 1410 slightly underfills the reservoir solder reservoir pad 1308 recessed in substrate 1302. In each case, a chip 1502/1602 having a corresponding solder pad 1504/1604, respectively, is brought in contact with the solder 1410 over the solder pad 1306.

Owing to the relationship between pressure and radius of curvature of solder (above), the present novel solder pad designs allow fine-tuning of the hydrostatic pressure in the reservoir, and by continuity, the hydrostatic pressure in the solder between substrate 1302 and chip 1502/1602 as well. The pressure can be tuned from slightly positive (pushing the chip 1502/1602 upward) to slightly negative (pulling the chip 1502/1602 down). This is not possible with the conventional solder pads, which only allow medium to high pressure in the solder, corresponding to a force on the chip typically two orders of magnitude (or more) larger than the chip's own weight, and prevent accurate alignment of the chip in the vertical and horizontal directions.

Some alternative embodiments of the present solder pad design are provided in FIGS. 17-21. For instance, in FIG. 17, UBM solder pad 1704 having substantially vertical sidewalls 1706 is fabricated entirely above the substrate 1702. As described above, these vertical sidewalls 1706 help to pin the solder 1708 to the pad 1704. Since a cavity with sidewalls is not used to form the pad in this example, a patterned photoresist (such as that described in accordance with the description of FIG. 14, above) formed on substrate 1702 can be employed to place the vertical sidewalls 1706. In this particular example, the sidewalls 1706 of pad 1704 are not perfectly vertical but make an angle β relative to the surface of the substrate 1702. According to an exemplary embodiment, β is greater than 10 degrees, e.g., from 10 degrees to about 80 degrees. Knowing the minimum contact angle $\theta_m$ of the solder 1708 to the UBM material, β is chosen to be larger than $\theta_m$ by at least a few degrees (e.g., β can be at least $\theta_m+5$ degrees, e.g., $\theta_m+10$ degrees). By way of example only, β can range from 5 degrees to 20 degrees, e.g., 10 degrees (although conditions of the metals such as roughness or presence of a minimum amount of oxides can affect the value of β). For a small solder curvature, $\theta \sim \beta$, and therefore $\theta > \theta_m$ which ensures the solder is not de-wetting.

Figure 18:
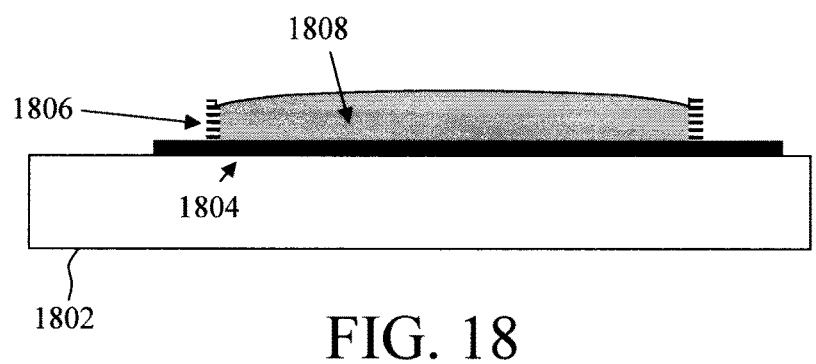
FIG. 18 is a diagram illustrating an alternative embodiment where the vertical sidewalls are inset from the edge of the pad according to an embodiment of the present invention.

Embodiments are also contemplated herein where the sidewalls of the solder pads are perfectly vertical. See, e.g., FIG. 18. FIG. 18 shows a variation of FIG. 17 where the sidewalls 1806 are perfectly vertical and are optionally inset from the edge of the pad 1804, making the fabrication (and lithographic alignment) simpler. Namely, alignment of the vertical sidewalls 1806 with the pad 1804 does not have to fall directly on the edge of the pad 1804 providing a greater tolerance during fabrication. Again, a patterned photoresist formed on substrate 1802 can be employed to place the vertical sidewalls 1806. The UBM material for the vertical sidewalls 1806 can be the same as or, as shown in FIG. 18, different from the UBM material on the horizontal pad 1904, which opens the door to a larger variety of fabrication techniques. The contact angle (as defined above) for this different sidewall material must be sufficiently small to prevent the solder 1908 from de-wetting of the nearly vertical wall, typically smaller than 60 degrees, which applies to most UBM materials.

Figure 19:
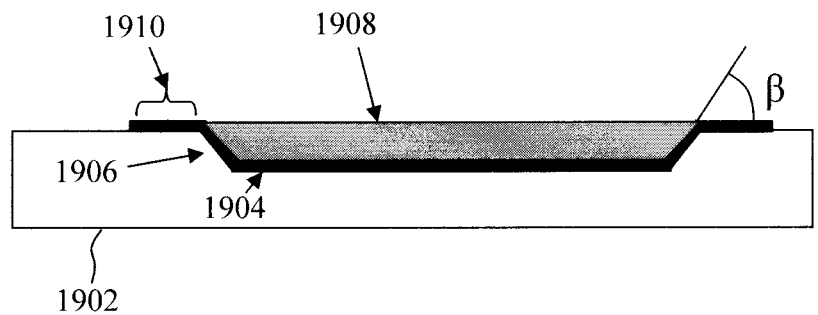
FIG. 19 is a diagram illustrating an alternative embodiment wherein the pad is recessed and the sidewalls of the pads are not vertical, but make an angle β, and a lip of UBM goes over the recessed edges according to an embodiment of the present invention.

An alternate embodiment is shown in FIG. 19. In this example, the solder pad 1904 is recessed in the substrate 1902. The sidewalls 1906 create a substantial angle but are not necessarily vertical. Namely, the sidewalls 1906 need to be of at least the angle β described above relative to the surface of the substrate 1902. A lip 1910 of UBM on the top surface of the substrate 1902 is used to improve fabrication tolerances at patterning of UBM to recess alignment. The solder will de-wet from the lip if the solder volume is small enough to result in a contact angle on the lip that is below the minimum contact angle for the materials used. The pad dimension and shape are hence defined by the recess.

Figure 20:
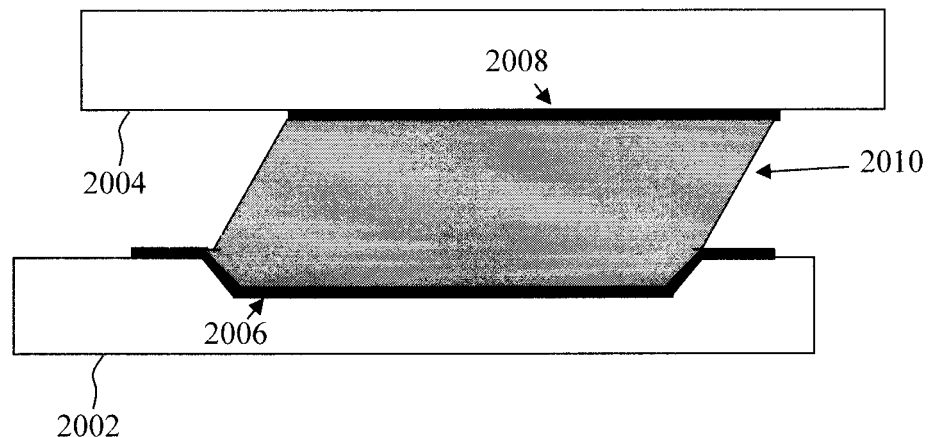
FIG. 20 is a diagram illustrating an assembly with joining solder where one of the chips has recessed pads and the pads are not fully aligned according to an embodiment of the present invention.

Flipped chip structures after assembly with the above-mentioned recess pad on one side and on both sides of the solder interface are shown in FIGS. 20 and 21, respectively. Namely, a flip chip structure is shown in FIG. 20 having a first chip 2002 and a second chip 2004, one of which (chip 2002 in this case) has the above-described recess pad 2006 with substantially vertical sidewalls, while the other (chip 2004 in this case) has a standard solder pad 2008. Solder 2010 forms at least one solder connection between the pads 2006 and 2008.

Figure 21A:
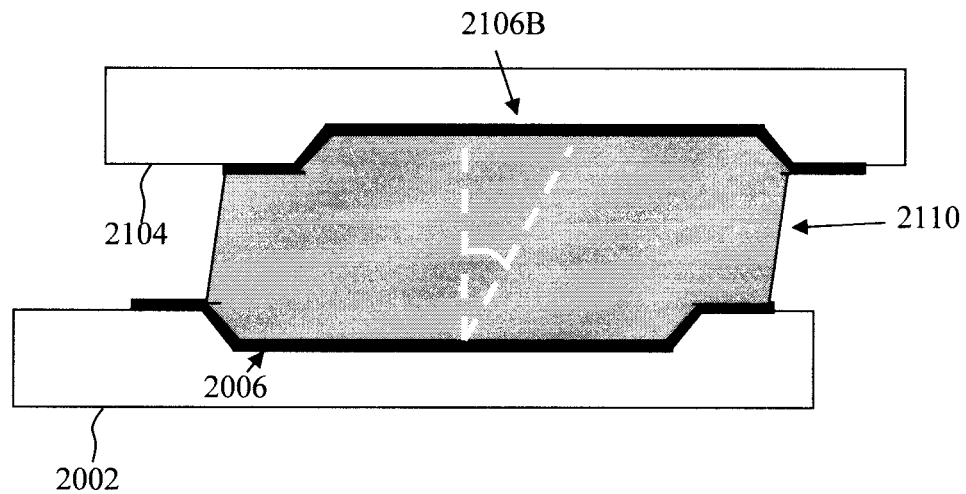
FIG. 21A is a diagram illustrating an assembly with joining solder where two of the chips have recessed pads and the pads are not fully aligned according to an embodiment of the present invention.
Figure 21B:
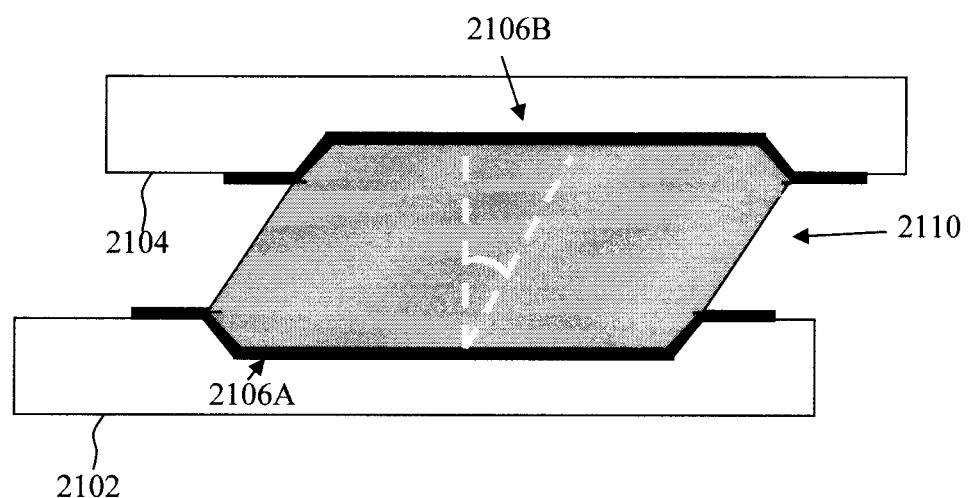
FIG. 21B is a diagram illustrating another assembly with joining solder where two of the chips have recessed pads and the pads are not fully aligned according to an embodiment of the present invention.

One may also employ the present solder pad designs on both sides of the solder interface. See, for example, FIGS. 21A and 21B. Namely, flip chip structures are shown in FIGS. 21A and 21B having a first chip 2102 and a second chip 2104, both of which have the above-described recess pad 2106A and 2106B, respectively. Solder 2110 forms at least one solder connection between the pads 2106A and 2106B. FIG. 21A and FIG. 21B show that the UBM may or may not be wet by the solder at assembly. This is a function of the processing history of the chips. As an example, a UBM finished with non-noble metal will typically from a surface oxide if not covered. This surface oxide can prevent wetting of the lip. Thus, one will observe the scenario depicted in FIG. 21A or FIG. 21B based on processing history.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A structure, comprising:
   a substrate;
   a solder pad on the substrate, wherein the solder pad has sidewalls extending up from a surface thereof, wherein the sidewalls are either vertical or extend up from the solder pad at an angle β of greater than 10 degrees, and wherein either the sidewalls are inset from outer edges of the solder pad such that the sidewalls are disposed on the surface of the solder pad away from the outer edges of the solder pad, or the sidewalls comprise a different material from the solder pad; and
   solder disposed on the solder pad, wherein a surface of the solder alongside the sidewalls has an effective solder angle $\theta_{EFF}$ relative to the sidewalls of greater than 10 degrees.

2. The structure of claim 1, wherein the solder pad comprises at least one metal selected from the group consisting of: nickel (Ni), copper (Cu), gold (Au), titanium (Ti), chromium (Cr), iron (Fe), platinum (Pt), palladium (Pd), ruthenium (Ru), and combinations thereof.

3. The structure of claim 1, wherein the sidewalls are present at outer edges of the solder pad.

4. The structure of claim 1, wherein the substrate comprises a cavity formed therein, and wherein the solder pad is disposed in the cavity.

5. The structure of claim 4, wherein the cavity is formed having a depth D of from 1 μm to 10 μM and ranges therebetween, and a width W of from 30 μm to 300 μm and ranges therebetween.

6. The structure of claim 1, wherein the solder has a thickness of from 3 μm to 10 μm, and ranges therebetween.

7. The structure of claim 1, further comprising:
   a solder reservoir pad connected to the solder pad by a conduit pad, wherein the sidewalls are present along the solder pad, and wherein other sidewalls are present along at least one of i) the solder reservoir pad and ii) the conduit pad.

8. A structure, comprising:

a first chip comprising a first solder pad;

a second chip comprising a second solder pad, wherein at least one of the first solder pad and the second solder pad has sidewalls extending up from a surface thereof, wherein the sidewalls are either vertical or extend up from the at least one of the first solder pad and the second solder pad at an angle $\beta$ of greater than 10 degrees, and wherein either the sidewalls are inset from outer edges of at least one of the first solder pad and the second solder pad such that the sidewalls are disposed on the surface of the at least one of the first solder pad and the second solder pad away from the outer edges of the at least one of the first solder pad and the second solder pad, or the sidewalls comprise a different material from at least one of the first solder pad and the second solder pad; and solder forming at least one solder connection between the first solder pad and the second solder pad, wherein a surface of the solder alongside the sidewalls has an effective solder angle θEFF relative to the sidewalls of greater than 10 degrees.

9. The structure of claim 8, wherein both the first solder pad and the second solder pad have sidewalls extending up from a surface thereof.

10. A method, comprising:

forming a solder pad on a substrate, the solder pad comprising sidewalls extending up from a surface thereof, wherein the sidewalls are either vertical or extend up from the solder pad at an angle $\beta$ of greater than 10 degrees, and wherein either the sidewalls are inset from outer edges of the solder pad such that the sidewalls are disposed on the surface of the solder pad away from the outer edges of the solder pad, or the sidewalls comprise a different material from the solder pad;

depositing solder onto the solder pad; and melting the solder on the solder pad, wherein a surface of the solder alongside the sidewalls, when melted, has an effective angle $\theta_{EFF}$ relative to the sidewalls of greater than 10 degrees.

11. The method of claim 10, further comprising:

forming a cavity in the substrate; and forming the solder pad in the cavity.

12. The method of claim 10, further comprising:

forming a solder reservoir pad on the substrate;

forming a conduit pad on the substrate connecting the solder reservoir pad to the solder pad; and forming the sidewalls along the solder pad, and forming other sidewalls along at least one of i) the solder reservoir pad and ii) the conduit pad.

* * * * *